United States Patent [19]

Krivokapic et al.

[11] Patent Number: 5,556,525
[45] Date of Patent: Sep. 17, 1996

[54] PVD SPUTTER SYSTEM HAVING NONPLANAR TARGET CONFIGURATION AND METHODS FOR OPERATING SAME

[75] Inventors: Zoran Krivokapic, Santa Clara; David S. Bang, Palo Alto, both of Calif.

[73] Assignee: Advanced Micro Devices, Inc., Sunnyvale, Calif.

[21] Appl. No.: 316,090

[22] Filed: Sep. 30, 1994

[51] Int. Cl.$^6$ ................................................. C23C 14/34
[52] U.S. Cl. ........................... 204/192.12; 204/298.08; 204/298.12
[58] Field of Search ................ 204/192.12, 298.08, 204/298.12, 298.18, 298.26

[56] References Cited

U.S. PATENT DOCUMENTS

| | | | |
|---|---|---|---|
| 3,654,110 | 4/1972 | Kraus | 204/192.12 |
| 3,669,871 | 6/1972 | Elmgren et al. | 204/298.12 |
| 3,988,232 | 10/1976 | Wasa et al. | 204/192.18 |
| 4,595,482 | 6/1986 | Mintz | 204/298.03 |
| 4,604,180 | 8/1986 | Hirukawa et al. | 204/298.18 |
| 4,606,806 | 8/1986 | Helmer | 204/298.12 |
| 4,747,926 | 5/1988 | Shimizu et al. | 204/298.12 |
| 4,834,856 | 5/1989 | Wehner | 204/192.24 |
| 4,956,070 | 9/1990 | Nakada et al. | 204/298.18 |
| 4,957,605 | 9/1990 | Hurwitt et al. | 204/192.12 |

FOREIGN PATENT DOCUMENTS

| | | | |
|---|---|---|---|
| 66-29467 | 2/1985 | Japan | 204/298.08 |
| 4-52276 | 2/1992 | Japan | 204/298.08 |
| 5-59542 | 3/1993 | Japan | 204/298.8 |
| 5-148644 | 6/1993 | Japan | 204/298.08 |

OTHER PUBLICATIONS

D. S. Bang et al., *Modeling of Ti Physical Vapor Deposition Systems,* IEEE International Workshop on Numerical Modeling of Processes and Devices for Integrated Circuits (NUPAD V, Honolulu) Jun. 1994, pp. 41–44.

D. S. Bang et al., *Profile Modeling of Collimated Ti Physical Vapor Deposition,* 10th Symposium on Plasma Processing, Electro Chemical Society, San Francisco, May 1994.

Primary Examiner—Aaron Weisstuch
Attorney, Agent, or Firm—Fliesler, Dubb, Meyer & Lovejoy

[57] ABSTRACT

A PVD sputter system having a nonplanar target surface is disclosed. The configuration of the nonplanar target surface is adjusted to provide improved uniformity in deposition film thickness and step coverage at the peripheral boundary regions of the substrate. Emission-inducing power is distributed independently to different portions of the nonplanar target surface so as to modify the deposition profile according to substrate size and other factors.

28 Claims, 10 Drawing Sheets

|←——————→| = 10 cm    drawn roughly to scale

PR = 1.0

PR = 1.0

PR = 1.0

1060            1060

1070

1050            1050

1010

Wafer

1000

PVD SPUTTER SYSTEM HAVING NONPLANAR TARGET CONFIGURATION AND METHODS FOR OPERATING SAME

BACKGROUND

1. Field of the Invention

The invention is generally directed to physical vapor deposition (PVD) sputter systems. The invention is more specifically related to an apparatus and method for PVD sputtering during the fabrication of semiconductor devices wherein it is desirable to obtain a combination of uniform deposition thickness, high deposition rate, and good step coverage.

2. Cross Reference to Related Publications

The following publication(s) is/are believed to be related to the present application and is/are cited here for purposes of reference:

(A) D. S. Bang. et al, "Modeling of Ti Physical Vapor Deposition Systems", IEEE International Workshop on Numerical Modeling of Processes and Devices for Integrated Circuits (NUPAD V, Honolulu) June 1994, pp 41–44;

(B) D. S. Bang. et al, "Profile Modeling of Collimated Ti Physical Vapor Deposition", 10th Symposium on Plasma Processing, Electro Chemical Society, San Francisco, May 1994; and (C) G. Box and N. Draper, "Empirical Model Building and Response Surfaces", John Wiley & Son, New York 1987.

3. Description of the Related Art

PVD sputtering is used within semiconductor processing and other arts for depositing metal films and the like onto substrate surfaces.

The substrate (e.g., semiconductor wafer) is typically a planar disk that is positioned face-down at the top of a vacuum plasma chamber.

A planar target is further typically positioned face-up within the chamber, in spaced apart and symmetrical counterfacing relation with the substrate. In older sputter systems the target was on top and the substrate on the bottom. The substrate-on-top versus on-bottom orientation has to do with keeping the substrate surface clean and is not directly related to the present invention. For purposes of consistency, the older configuration with the substrate on the bottom will be shown, but it is to be understood that other orientations are fully within the contemplation of this disclosure.

The target is made of the material that is to be sputter deposited onto the substrate surface. Examples include, but are not limited to, metals such as aluminum (Al), titanium (Ti), copper (Cu), and alloys or compounds of these materials.

Emission-inducing energy is applied to the active face of the target in the form, for example, of a plasma containing accelerated argon ions. In response to such bombardment, the active face of the target emits small particles composed of the target material (e.g. aluminum). The emitted particles follow a generally linear trajectory from their point of emission on the target surface to a collision point on the counterfacing surface of the substrate. Physical adhesion mechanisms cause the target particles to bond to the surface of the substrate.

The physical dimensions and positionings of the substrate and target play important roles in determining rate of deposition and the uniformity of the deposited film. The distribution of emission-inducing energy across the target also plays a role.

Ideally, the target should be very wide relative to the substrate so that the target represents an infinite source plane to the particle-receiving face of the substrate. In such a situation, if the particle receiving face of the substrate is perfectly planar and parallel to the target, every point on the substrate receiving face will receive the same contribution of deposition particles and film thickness will be uniform across the entire substrate.

Unfortunately, this ideal arrangement is not possible in practical implementations of PVD sputter chambers. The target has a finite size that is usually the same order of magnitude as that of the substrate. Non-uniformities develop across the substrate for characteristics such as deposition film thickness and deposition rate due to boundary conditions.

In the fabrication of semiconductor devices, the substrate surface is often not perfectly planar. Nonlinear features such as channels and mesas are typically found on the semiconductor substrate. It is often desirable to coat the sidewalls and/or bottoms of each channel or mesa with a layer of deposition-material having a prescribed thickness. However, the linear nature of the trajectories followed by the emitted target particles in PVD systems create shadow effects. Not every portion of the substrate surface receives the same amount of target material at the same rate in the case where the substrate surface includes nonlinearities such as channels or mesas.

The term, "channel" is used herein in a broad sense to include features in semiconductor devices and the like such as contact vias, trenches, and other depressions which are to be fully or partially filled with deposition material.

The term, "mesa" is similarly used herein in a broad sense to include any device feature rising above a surrounding plane where the feature and/or its surrounding plane are to be coated with deposition material.

The term, "step coverage" is used herein in a qualitative sense to refer to the ability to coat one or more sidewalls or bottom of a channel or mesa to a desired thickness. The term, "step coverage" is further used herein in a quantitative sense to refer to the ratio of film thickness at the bottom of a sidewall relative to film thickness at the top of the same sidewall, where the sidewall has a predefined height.

The term, "step coverage uniformity" is used herein in a quantitative sense to mean the statistical standard deviation (sigma) of step coverage across a given substrate.

The term, "flat coverage uniformity" is used herein in a quantitative sense to mean the statistical standard deviation (sigma) of film thickness across a given substrate taking into consideration only substantially planar regions (not step regions) of the substrate surface.

The term, "film thickness uniformity" is used herein in a quantitative sense to mean the statistical standard deviation (sigma) of film thickness across a given substrate, taking into consideration all regions (flat and step regions) of the substrate surface.

The term, "bottom coverage uniformity" is used herein in a quantitative sense to mean the statistical standard deviation (sigma) of film thickness across a given substrate, taking into consideration only regions at the bottom of channels or mesas.

It has been common practice in the semiconductor fabrication arts to sputter deposit films to a thickness substantially greater than the desired or minimally acceptable amount in order to make sure that adequate thickness is obtained across the entire substrate despite nonuniformities in step coverage and film thickness. Sometimes, the extra-thick portions of the deposited material have to be polished away or otherwise removed in order to obtain planarity and/or uniform flat coverage across the substrate. Such over-deposition followed by removal of excess material is wasteful of resources, time, and energy.

It has also been common practice in the semiconductor fabrication arts to increase the radius of wafers every so many years in order to obtain higher yield per wafer and/or in order to be able to economically mass produce integrated circuit chips of larger dimensions. Alterations in wafer size have previously required major alterations to production equipment, including making physical vapor deposition sputter chambers of larger size to house larger and larger targets. PVD sputter chambers typically need to support ion plasmas at very low pressures, on the order of 2 milliTorr or less, and are thus relatively costly to manufacture. It would be desirable to have a PVD sputter system that can accommodate wafers of different sizes while providing relatively similar uniformities in step coverage and film thickness.

SUMMARY OF THE INVENTION

It is an object of the invention to provide a sputter apparatus and method that provides an improved combination of deposition thickness uniformity and step coverage uniformity.

It is a further object of the invention to provide a sputter apparatus and method that can be easily modified to accommodate wafers or other substrate surfaces of changing size.

A sputter system in accordance with the invention comprises a nonplanar sputter target positioned relative to a to-be-coated substrate such that the maximum angle of particle emission is below a prespecified maximum.

In accordance with one feature of the invention, power is independently distributed to different parts of the nonplanar target and adjusted to provide substantially uniform rates of deposition across the substrate surface.

In accordance with a second feature of the invention, the nonplanar target is subdivided into isolated target members placed at different heights relative to the substrate surface and energized by independent sources of emission-inducing energy.

In accordance with a third feature of the invention, the amount of emission-inducing energy applied to each portion of the nonplanar target is set according to the travel distance of the particles that are to flow from that portion to the substrate surface.

In accordance with a fourth feature of the invention, the nonplanar target is configured such that some portions of the target provide a collimation function for particles emitted from other portions of the same nonplanar target.

Other aspects of the invention will become apparent from the below detailed description.

BRIEF DESCRIPTION OF THE DRAWINGS

The below detailed description makes reference to the accompanying drawings, in which.

DETAILED DESCRIPTION

Figure 1A:
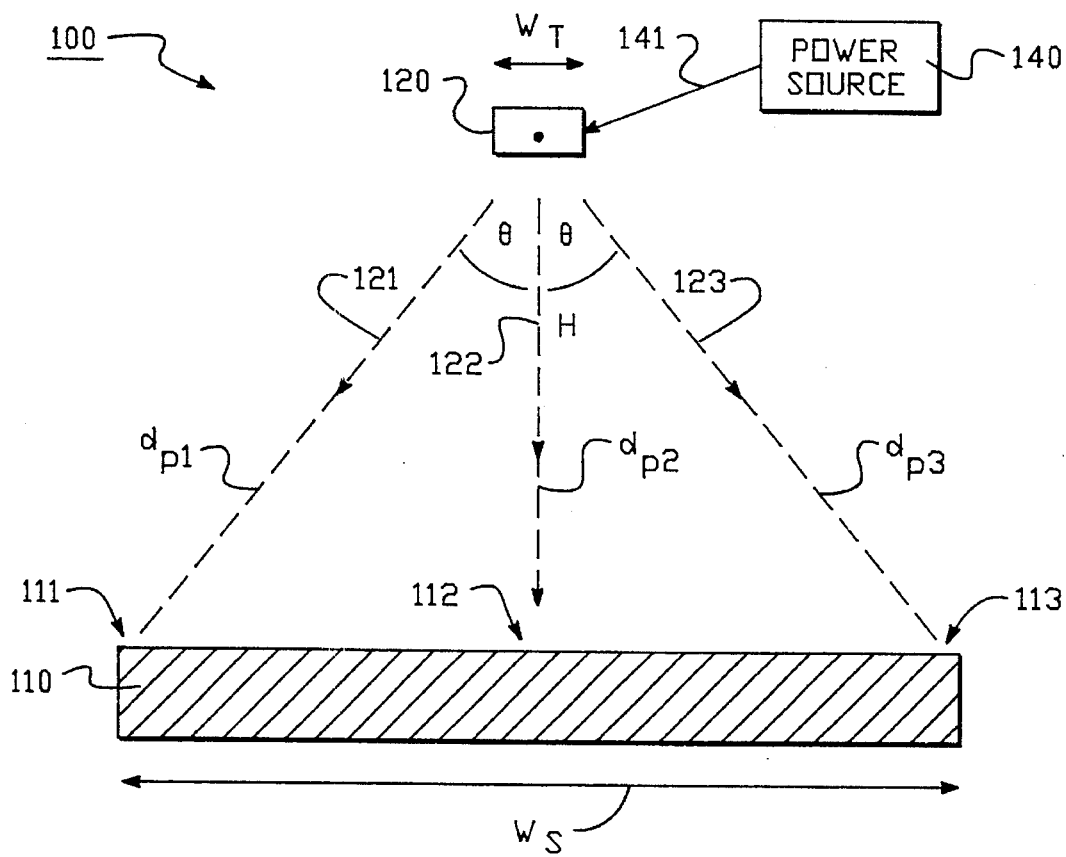
FIG. 1A is a cross sectional view of a hypothetical point-source sputtering system that is used for explaining the principles of operation of the invention.

FIG. 1A is a cross sectional view of a hypothetical point-source sputter system 100 that is used for explaining principles of operation of the present invention.

In FIG. 1A, a planar, disk-shaped substrate having a width, $W_S$, is shown at 110. A central, top surface portion of the substrate is designated as 112. Respective left and right portions of the substrate top surface are designated as 111 and 113.

A hypothetical point-source target 120 having a width $W_T$ of approximately zero is positioned symmetrically above and spaced away from the central surface portion 112 of the substrate 110. The distance between the point-source target 120 and the substrate center 112 defines a height, H.

A power source 140 is coupled by way of means 141 to the point-source target 120 in order to cause the target 120 to emit deposition particles along linear trajectories directed to the substrate surface. The power source 140 can include a source of accelerated argon ions or the like. The power source 140 can further include confinement magnets for confining accelerated particles near the region of the target 120.

The emission trajectories of the target particles are uniformly distributed about three dimensional space. Three such trajectories are illustrated by way of dashed lines in FIG. 1A and respectively referenced as 121, 122 and 123. Trajectory 121 has a particle travel distance of $d_{p1}$ and carries particles from target 120 to the left surface region 111 of the substrate 110. Trajectory 122 has a travel distance of $d_{p2}$ equal to height H and carries target particles from the target 120 to the central surface region 112. Trajectory 123 has a particle travel distance of $d_{p3}$ and carries target particles from the target 120 to the right surface region 113. Each of trajectories 121 and 123 defines an angle of θ between itself and the normal of the substrate surface (the hypothetical perpendicular drawn from the substrate surface). Note that as height H decreases, the trajectory angle θ (or "angle of attack" θ as it will also be called) increases, and vice versa.

It has been shown that film deposition rate (r) in sputtering systems is inversely proportional to the particle travel distance ($d_p$) raised to a power (α) approximately between one and two. {$r=f(d_p^{-\alpha})$; where $1<\alpha<2$.} Thus, the deposition rates of the left and right trajectories, 121 and 123, are less than that of the central trajectory 122.

Figure 1B:
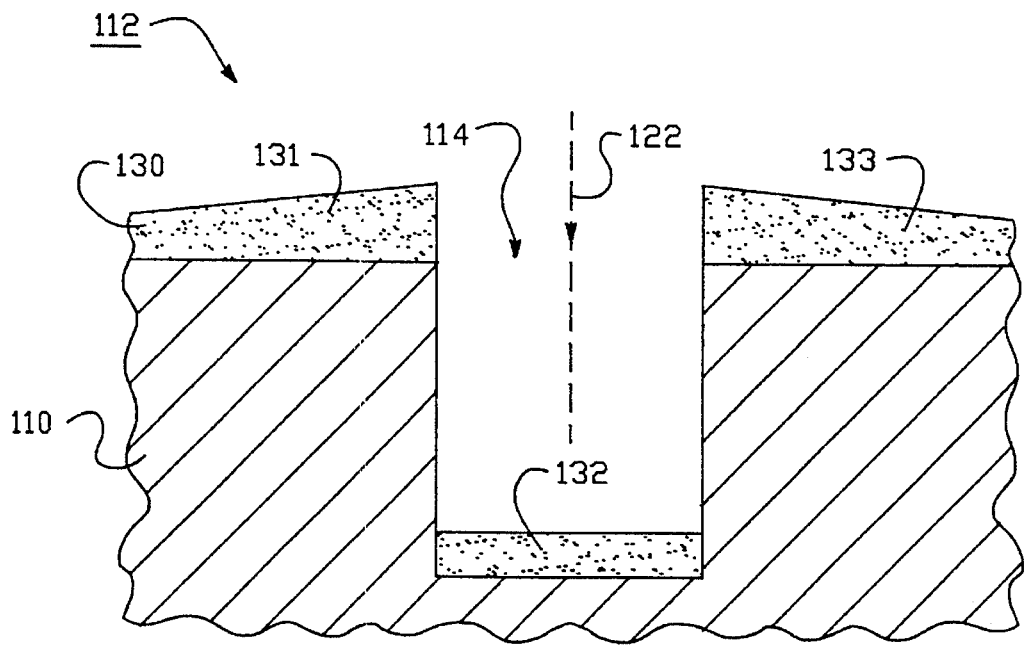
FIG. 1B is a cross sectional magnified view showing a central surface portion of the substrate, including a first to-be-coated channel.

FIG. 1B is a magnified view showing a first channel 114 formed at the central surface region 112 of substrate 110. The central trajectory 122 deposits target material 132 vertically into the bottom of the channel. The trajectories (not shown) to the left and right of 122 respectively deposit target material for regions 131 and 133. Since the deposition rates of the side trajectories are less than that of the central trajectory 122, the thickness of material deposited at 131 and 133 slopes down as one moves horizontally away from the central trajectory 122. (The slope is exaggerated in FIG. 1B for purpose of illustration.) If a desired minimum thickness is to be obtained at the outer portions of depositions 131 and 133, an excess amount of material needs to be deposited at 132 in order to assure that film regions 131 and 133 will have adequate thickness. As explained above, this is disadvantageous because it wastes target material. The target is eroded faster than absolutely necessary and has to be replaced more often. The deposition of excess target material wastes time, energy, and increases the cost of production. In some instances, the excess material near the central portion 112 of the substrate has to be polished away or etched back in order to obtain uniform thickness across the entire width $W_S$ of the substrate. This also wastes time, energy and resources.

Figure 1C:
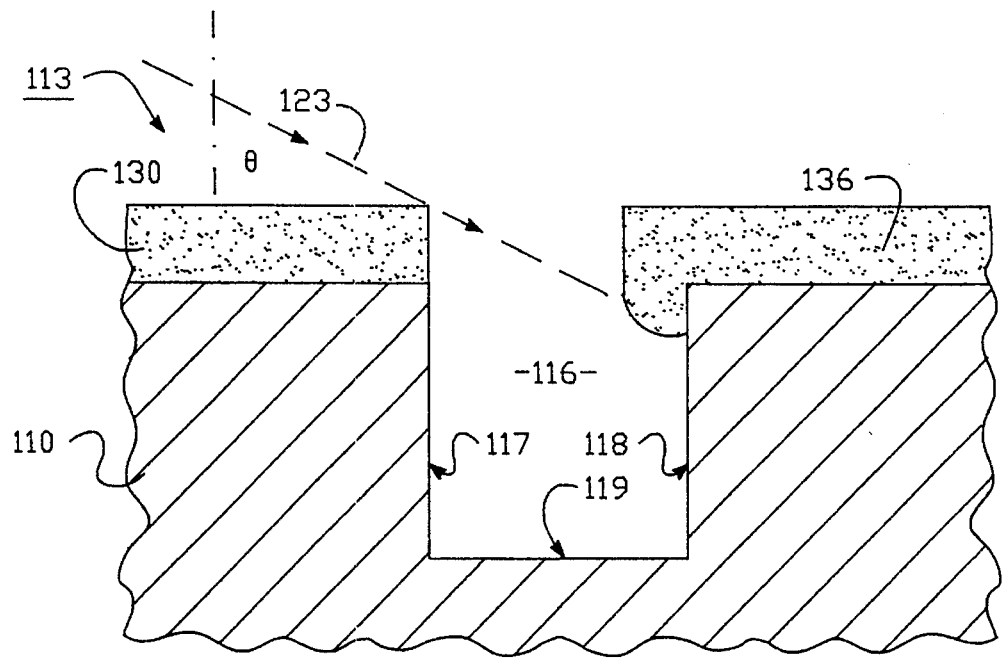
FIG. 1C is a cross sectional magnified view of a border portion of the substrate surface, including a second to-be-coated channel.

Referring to FIG. 1C, the maximum trajectory angle θ at which target particles are propelled to the substrate plays an important role in step coverage. FIG. 1C shows a magnified cross sectional view of right surface region 113, wherein a second channel 116 has been formed. Trajectory 123 approaches second channel 116 with the attack angle θ. The left sidewall 117 of channel 116 casts a shadow on the right sidewall 118 and bottom of the channel. The shadow height increases up along the right sidewall 118 as the attack angle θ increases. As a result of this shadowing effect, only a top portion of the right sidewall 118 is covered with target material 136 contributed by trajectory 123. The entire left sidewall 117, the lower portion of right sidewall 118 and the bottom 119 of the channel do not receive deposition contribution from trajectory 123. In many cases it is desirable to uniformally coat the entire inner surface of channel 116 with the target material 136. However, the shadowing effect of the trajectory angle θ prevents this from occurring.

The above FIGS. 1A–1C are understood to the hypothetical conditions provided herein for purposes of illustration. The target in an actual sputter system will have some physical width $W_T$ greater than zero and hence will act at least as a two-dimensional source rather than a point-source.

Figure 2:
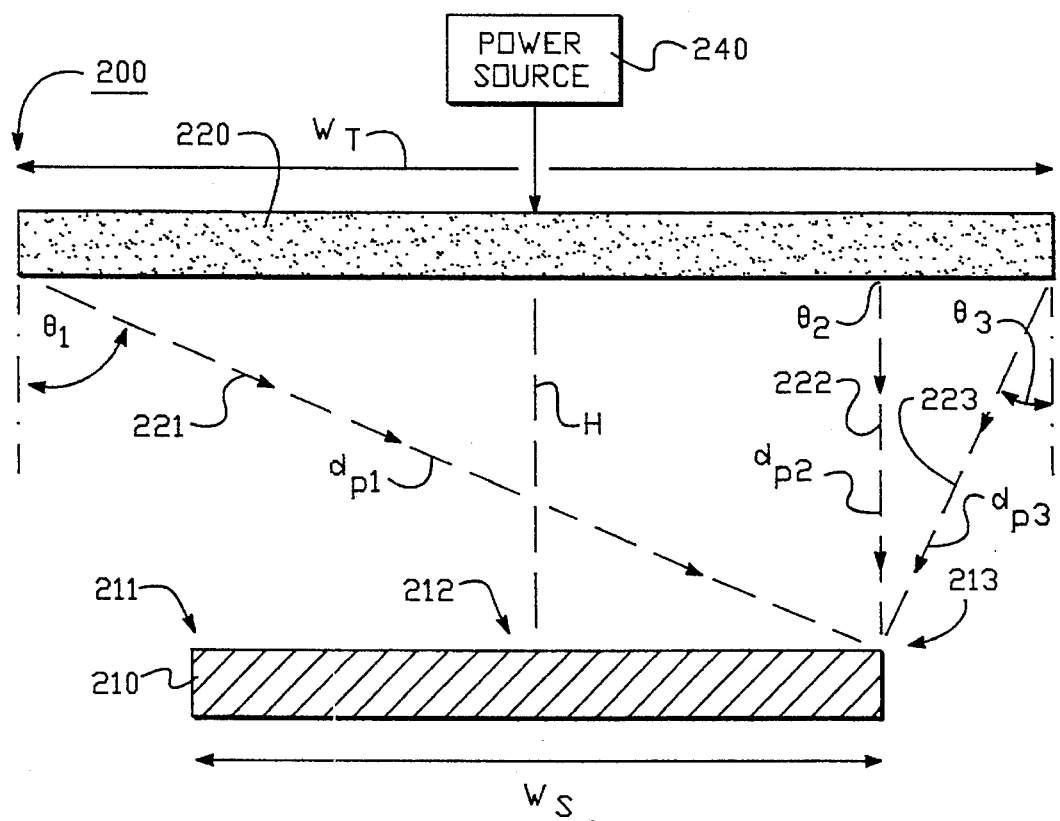
FIG. 2 is a cross sectional view of a conventional sputter system having a planar target.

FIG. 2 shows the cross-section of a conventional configuration within a sputter chamber. Like-reference numbers in the "200" number series are used in FIG. 2 to denote elements having like counterparts in FIG. 1A, and as such they will not be again explained in detail.

In FIG. 2, a planar, disk-shaped target 220 having width $W_T$ is provided in parallel, spaced apart, and centralized relation to the substrate 210, where the latter has width $W_S$. The target width $W_T$ is substantially larger than the substrate width $W_S$.

The emission surface of the target 220 generally defines a continuum of point sources distributed across the circular bottom surface area of the target 220. Each target point source contributes partially to the deposition occurring at corresponding receiving points on the top surface of substrate 210. The power output of power source 240 is uniformly distributed to all emission points (target point sources) of the target 220.

Deposition at each receiving point on the substrate surface, including respective left, center, and right regions, 211, 212, and 213, may be calculated as the summed (or integrated) contribution of particles received from each of the point sources along the emission surface of target 220.

By way of example, the right peripheral region 213 of the substrate receives particles contributed from the left edge of target 220 by way of left trajectory 221. Trajectory 221 has a particle travel distance of $d_{p1}$ and it forms a first attack angle $\theta_1$ with the substrate surface normal. Similarly, particles received from the target portion directly above substrate region 213 travel along a middle trajectory 222 which has a travel distance of $d_{p2}$ and defines an attack angle of $\theta_2=0$ relative to the substrate surface normal. And likewise, particles received from the right extreme of target 220 travel along a right-side trajectory 223 for deposition onto substrate region 213. Trajectory 223 has a particle travel distance of $d_{p3}$ and defines an attack angle of $\theta_3$ relative to the substrate surface normal.

As explained above, film deposition rate (r) at each receiving point on the substrate surface will be inversely proportional to the particle travel distance ($d_p$) of each target point-source raised to a prespecified power (α). The contribution received at each substrate surface point, from each target point-source has to be summed to determine the accumulated deposition at each receiving point on the substrate surface. {$R_i=\int f(d_p^{-\alpha})\cdot dx\cdot dy$; for all x and y on the target surface, where $R_i$ is the accumulated rate of deposition at a given surface point i on the substrate surface.}

The specific dimensions of the target width $W_T$, the substrate width $W_S$, and the target-to-substrate separation height H need to be known in order to determine the cumulative deposition rate at each receiving point on the substrate surface.

In one specific embodiment, which will be referred to herein as the reference system 200, the substrate 210 is a planar, circular disk having a width of $W_S=20$ cm (twenty centimeters). The target 220 is also a planar, circular disk and has a width of $W_T=30$ cm. The target-to-substrate separation height is H=15 cm. The power source 240 delivers a normalized power of one unit per cm² to the emission surface of target 220. In this particular situation, the maximum trajectory angle $\theta_1$ of the left-most trajectory path 221 is approximately 59°. The uniformity of step coverage is defined in part by this 59° maximum trajectory angle.

The inventors herein recognized that step coverage uniformity could be improved if the maximum trajectory angle $\theta_1$ could be reduced. They also recognized that, if one simply increased the target-to-substrate separation height H uniformly across the target, the deposition rate would then disadvantageously decrease. The solution was to find a compromise between these counterposed attributes. The inventors herein decided to vary target point-to-substrate separation height H at each point of the target as a function of both the allowed maximum trajectory angle $\theta_1$ and desired deposition rate. In other words, they decided to make the target nonplanar relative to the substrate. This produced unexpected advantages.

The solution of using a nonplanar target further includes the step of optionally varying the amount of emission-inducing energy applied to each portion of the nonplanar target as a function of that portion's distance from the substrate.

Figure 3:
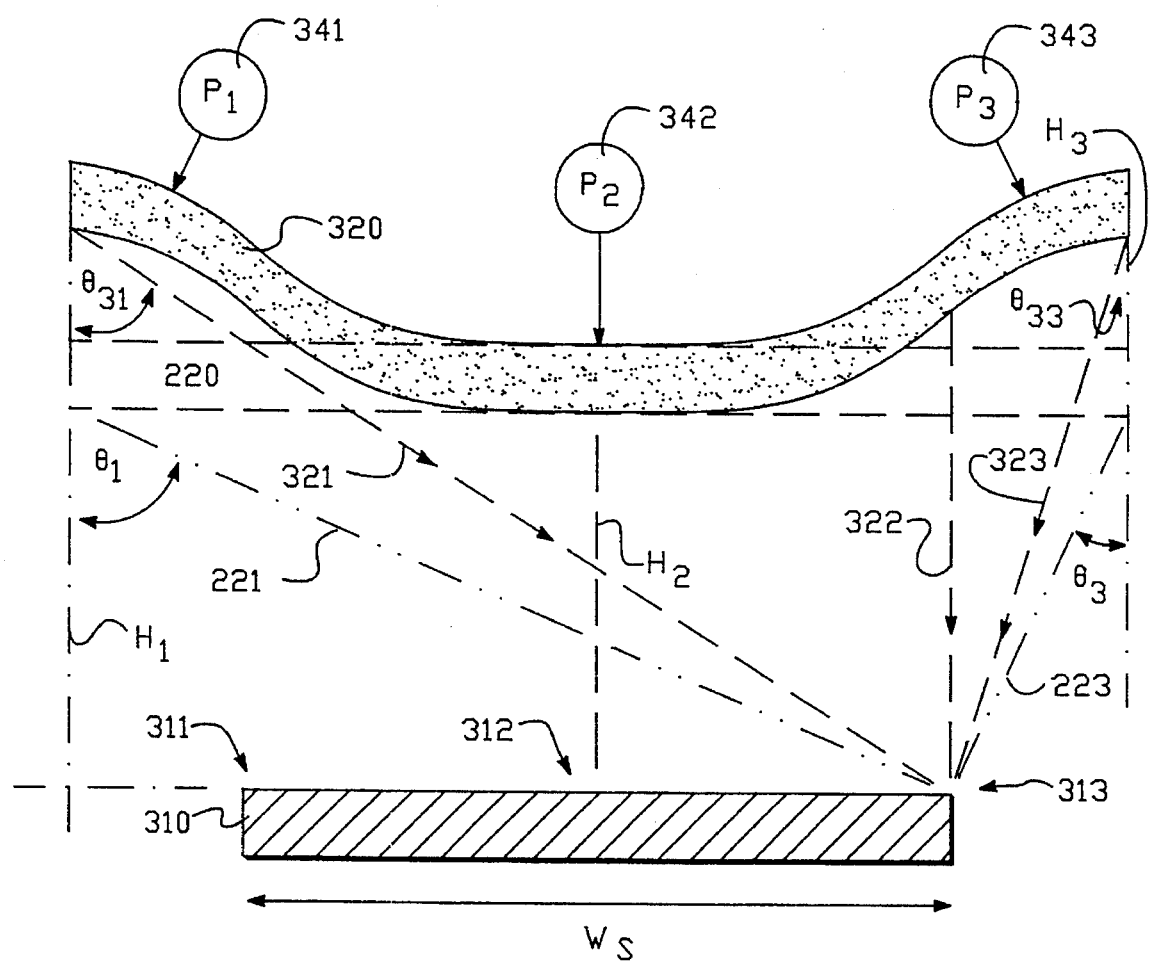
FIG. 3 is a cross sectional view of a first embodiment in accordance with the invention having a nonplanar target.

FIG. 3 shows a first embodiment 300 in accordance with the invention that is to be compared to scale against the reference system 200 of FIG. 2. Like reference numbers in the "300" numbering system are used in FIG. 3 for elements having corresponding components numbered in the "200" series in FIG. 2.

The sputter system 300 of FIG. 3 includes a nonplanar target 320 that is configured to present a generally convex emission surface relative to the deposition surface 311–313 of the substrate 310. The peripheral portions of target 320 are raised to respective left and right heights, $H_1$ and $H_3$, that are each greater than the central height, $H_2$.

The increase of the peripheral target heights, $H_1$ on the left and $H_3$ on the right, works to reduce the trajectory angles of the target particles emitted from those peripheral target sites and thereby improves the uniformity of step coverage across the substrate surface.

By way of example, note that the top right surface point 313 of substrate 310 receives a first contribution of deposition material from the left edge of the target 320 by way of trajectory 321. The attack angle, $\theta_{31}$ of trajectory 321 is less than the attack angle $\theta_1$ of previous trajectory 221 in the reference system 200. Surface point 313 further receives a contribution from the right edge of target 320 by way of trajectory 323. The attack angle $\theta_{33}$ of trajectory 323 is less than the attack angle $\theta_3$ of the previous trajectory 223 in the reference system 200. Since angle $\theta_{31}$ is less than $\theta_1$, and angle $\theta_{33}$ is less than $\theta_3$, shadowing effects are decreased in magnitude and the uniformity of step coverage is improved across the substrate surface 311–313.

Improved step coverage does not come freely, however. The particle travel distances ($d_{p1}$ and $d_{p3}$) of trajectories 321 and 323 are greater than those of the previous trajectories, 221 and 223 respectively. The overall rate of material deposition suffers as a consequence.

To overcome this problem, power is distributed to each of the regions of target 320 on an independent region-by-region basis. A first independent power supply 341 supplies emission-inducing power $P_1$ to the left periphery of target 320. A second power supply 342 supplies power $P_2$ to the central portion of target 320. A third independent power supply 343 provides emission-inducing power $P_3$ to the right peripheral region of target 320. The emission-inducing powers, $P_1$ and $P_3$ of the respective first and third power supplies 341 and 343 are preferably set greater than the power $P_2$ of second power supply 342 so that the peripheral edges of the target 320 have a higher rate of particle emissivity. This compensates for the increased particle travel distance along trajectories 321, 322, and 323 so as to bring the deposition rate at substrate site 313 back to par with that of site 213 in the reference system 200.

FIG. 3 shows the nonplanar target 320 as having a unitary construct. Such a unitary construct does not allow power differentiation to be provided by way of electric voltage difference in cases where the target material 320 is a conductive material such as aluminum, titanium, copper or an alloy of one or more of these metals. One way to provide power differentiation in such a situation is to use independently-driven flux-confining magnets at each of the independently-powered target sites. The magnets may be of the fixed or moving kind. An example of the use of a distributed magnet system for independently powering different parts of a planar target is seen in the Applied Materials Endura 5500™ sputtering chamber which is available from Applied Materials of Santa Clara, Calif. Local magnetic flux strength determines the velocity of emission-inducing particles striking the target surface, and this in turn defines the local surface emissivity. It should be apparent that in the case where the target is symmetrical about its middle axis ($H_2$), the left and right power supplies, 341 and 343, can be merged into a single supply (not shown) whose output may be set differently from that of the central power supply 342.

Figure 4:
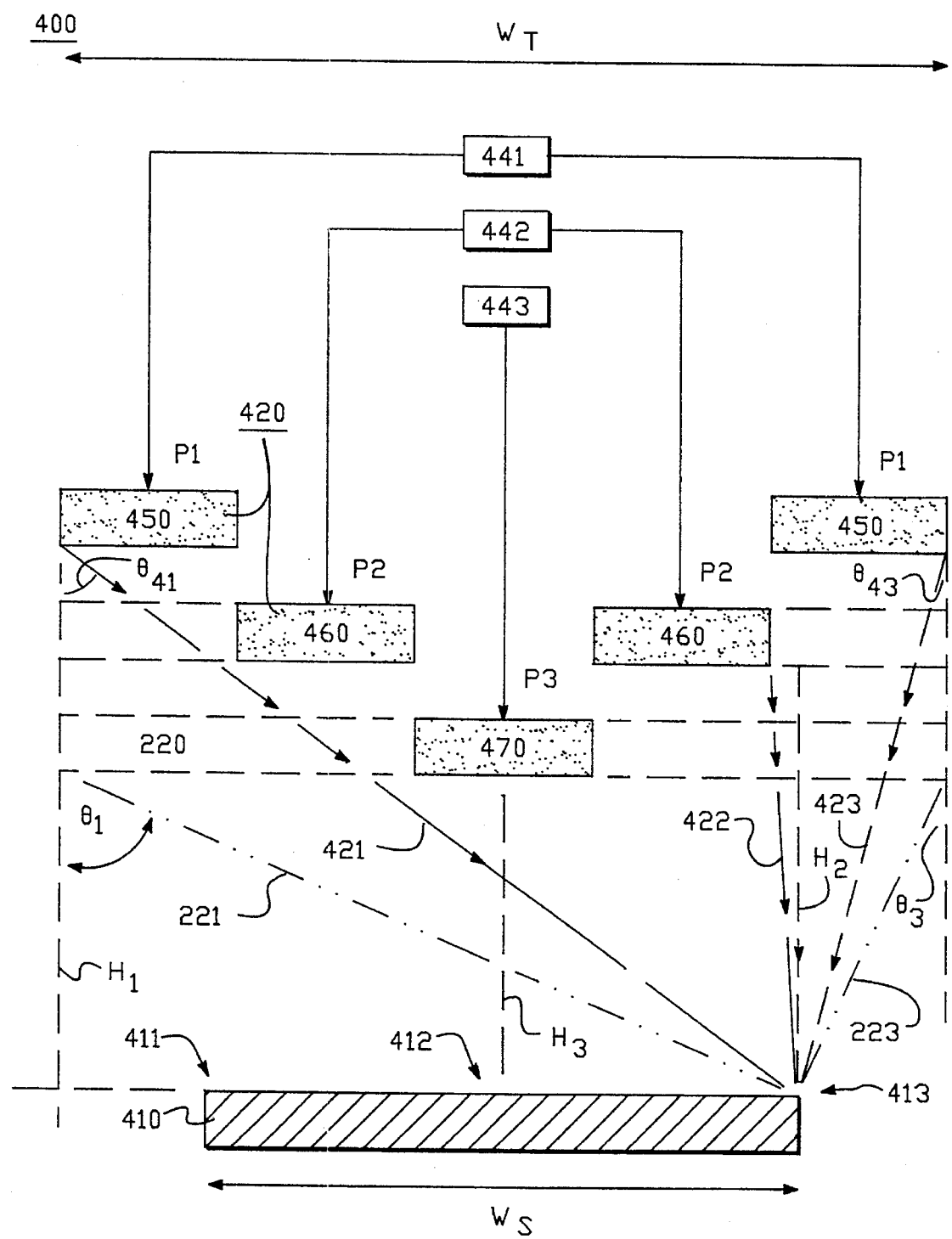
FIG. 4 is a cross sectional view of a second embodiment in accordance with the invention having isolated target members placed at different heights relative to the substrate surface with each target member receiving power from an independent power source.

FIG. 4 shows a second embodiment in accordance with the invention wherein the overall target 420 is fragmented into first through third, independent target members 450, 460, and 470 each being adjustable to have a different height relative to the substrate surface 411–413. The multi-member target configuration 400 of FIG. 4 is drawn to the same scale as the reference system 200 of FIG. 2 and to that of the unitary target configuration 300 of FIG. 3 so as to enable simple comparison among these systems (200, 300, 400). Like reference numbers in the "400" numbering system are used in FIG. 4 for elements having corresponding components numbered in the "300" series in FIG. 3.

The multi-member target configuration 400 of FIG. 4 includes as its lowest target member 470, a circular disc having an active surface positioned at a height $H_3$ (equal to reference height H) centrally over substrate 410. Positioned above the lowest target member 470, at a second height $H_2$ (greater than reference height H) there is the second target member 460 which has an annular shape (ring shape) surrounding the hypothetical upward projection of the lowest target member 470. Positioned above the second target member 460, at a height $H_1$ (greater than second height $H_2$) there is the first target member 450 which has an annular shape surrounding the hypothetical upward projection of middle ring 460. Target members 450, 460, and 470 are electrically insulated from one another.

Although a plurality of three target members is shown in FIG. 4, it is to be understood that the number of target members may be reduced to two or increased to any desired number above three.

Although the respective heights of the first through third target members 450, 460, and 470 are arranged in successively decreasing order, $H_1 > H_2 > H_3$, it is to be understood that the respective heights of the plural target members can be arranged into any otherwise desired, nonplanar configuration.

A first independent power supply 441 supplies a first emission-inducing power $P_1$ to the first target member 450. A second independent power supply 442 supplies a second emission-inducing power $P_2$ to the second target member 460. A third power supply 443 similarly applies a third emission-inducing power $P_3$ to the third target member 470. Power levels $P_1$, $P_2$, and $P_3$ may be set independently of one another so as to define different particle emission rates (per $cm^2$) for each of the respective target members, 450, 460, and 470.

The combined active width of target members 450, 460, and 470 is substantially equal to the active width $W_T$ of the reference target 220 in FIG. 2. The individual active width of each of target members 450, 460, and 470 may be set as desired. In the example of FIG. 4, the lower target member 470 has an effective width equal to approximately one-fifth of $W_T$ while the other two target members 460, 450 each have an effective emissive width equal to two-fifths of $W_T$. The emission inducing power applied to the respective first through third multiple target members 450, 460, and 470 is preferably set such that $P_1 > P_2 > P_3$, where the power is measured in terms of Kilowatts per unit area of active target surface or in like terms for determining the per unit area emissivity of each target member, 450, 460, and 470.

As seen, the top right surface point 413 of substrate 410 receives a first contribution from the left extreme of first target member 450 by way of first trajectory 421. The left side trajectory 221 of the reference system is shown as a dashed double-dot line for purposes of comparison. Note that the angle of attack, $\theta_{41}$ of trajectory 421 is substantially less than the angle of attack, $\theta_1$ of reference trajectory 221.

Note also, by way of an aside whose relevance will be understood below, that trajectory 421 avoids colliding into the second target member 460 by a small distance. If the height $H_1$ of the first target member 450 were to be raised by an appropriate distance, and/or the height $H_2$ of the second target member 460 were to be lowered by an appropriate distance, then trajectory 421 would be blocked by the intervening body of the second target member 460. The maximum angle of attack for particles contributing to substrate surface point 413 would then be decreased to less than $\theta_{41}$. In such a case, the nonplanar configuration of the target surface would provide a self-collimating function that limits the maximum angle of attack.

In addition to the contribution from particle trajectory 421, the right surface point 413 of substrate 410 receives a further contribution from the right extreme of the middle target member 460 by way of trajectory 422. The particle travel distance ($d_{p2}$) of trajectory 422 is approximately equal to separation height $H_2$.

Substrate surface point 413 further receives deposition contribution from the right extreme edge of the highest target member 450 by way of trajectory 423. Reference trajectory 223 is drawn as a dashed double-dot line nearby for purposes of comparison. Note that the angle of attack $\theta_{43}$ of trajectory 423 is substantially less than that the angle of attack $\theta_3$ of reference trajectory 223.

With appropriate adjustment of the heights, effective widths and applied powers of the multiple target members, 450, 460, and 470, it is possible to vary the deposition characteristics of the multi-target sputter system 400 so as to obtain improved step coverage or better film thickness uniformity or a compromised improvement in both as will be explained below.

The number of variations possible for the multi-target configuration shown in FIG. 4 is quite large. Rather than building a physical embodiment for each possibility, the inventors herein used a computer simulation that calculates the theoretical deposition patterns on a substrate including a plurality of channels for thousands of different target configurations, each having one or more unique settings for target member placement, target member width, target member power, and so forth.

The computer simulation that was used is generally known as SPEEDIE (Stanford Profile Emulator for Etching and Deposition in IC Engineering). Various versions of this simulation package are available from the Stanford Research Center of Stanford University, Palo Alto, Calif. The particular version used by the inventors included a PVD simulator module operating in accordance with the above cited paper by D. S. Bang et al, "Modeling of Ti Physical Vapor Deposition Systems", NUPAD V, Honolulu June 1994. Of course, other similarly-suitable simulators may be used for modeling the performance for various target and substrate configurations.

It was found using the SPEEDIE modeler that several nonplanar, staggered arrangements of independently-powered target members provided improved step coverage and/or improved deposition uniformity relative to that of the reference system 200. FIGS. 7–10 show specific examples of configurations which provided improved performance in one or more areas of measure (e.g., flat coverage uniformity, step coverage, step coverage uniformity, average deposition rate, average bottom coverage, and minimum sidewall coverage).

Figure 5:
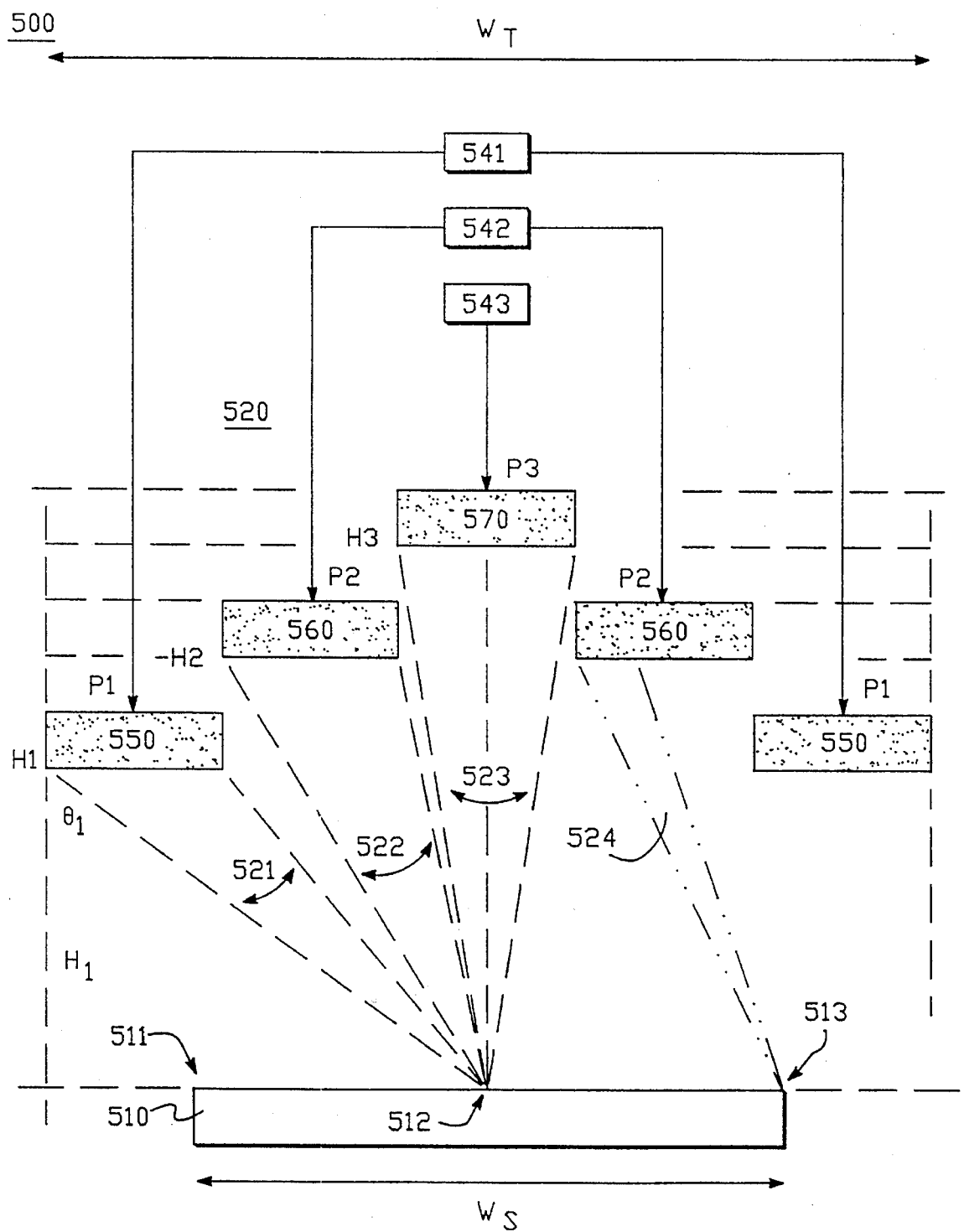
FIG. 5 is a cross sectional view of a third embodiment wherein the nonplanar target has a generally concave shape relative to the substrate.
Figure 6:
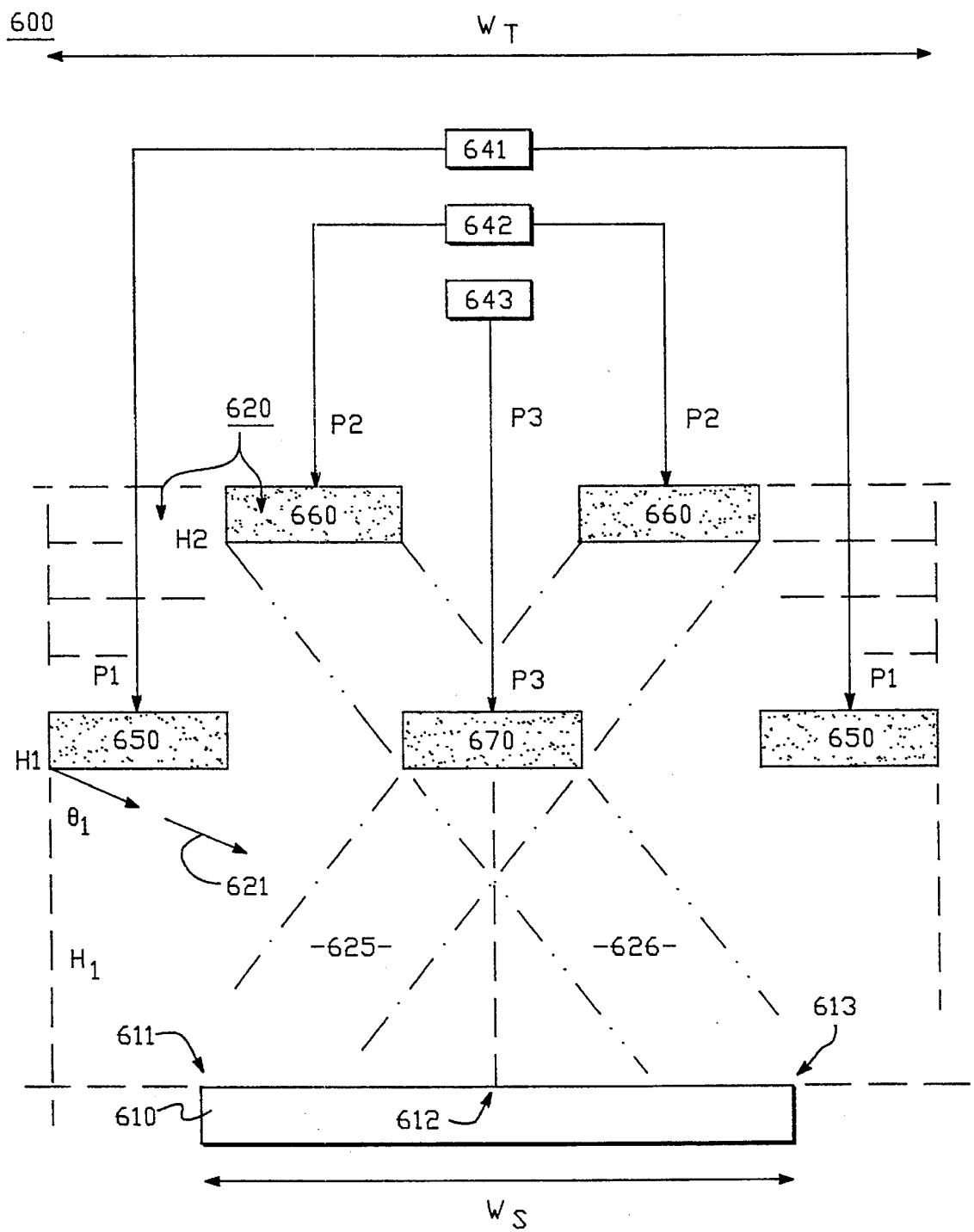
FIG. 6 is a cross sectional view of a fourth embodiment wherein the nonplanar target is comprised of a staggered configuration of independently powered members and has a self-collimating feature.

In general, a nonplanar target can take on many configurations including, but not limited to: (a) convex, (b) concave, and (c) staggered. The convex configuration has been covered above by the embodiments shown in FIGS. 3 and 4 (continuous and fragmented). FIGS. 5 and 6 respectively show fragmented embodiments of the concave and staggered configurations in a generic sense. (Continuous rather than fragmented embodiments of the concave and staggered configurations can be constructed by linking together the fragmented target members of FIGS. 5 and 6 with vertical connections. In the latter continuous-construct cases, independent power to each target section would be provided using magnetic flux intensity rather than electrical voltage as the means for varying applied power.)

Like reference numbers in the "500" numbering system are used in FIG. 5 and in the "600" numbering system are used in FIG. 6 for elements having corresponding components numbered in the "400" series in FIG. 4.

Referring to FIG. 5, the concave configuration 500 includes first through third target members 550, 560, and 570 respectively arranged and successively higher heights, $H_1$, $H_2$, and $H_3$. Independent power supplies 541, 542, and 543 respectively supply power levels $P_1$, $P_2$, and $P_3$ to respective target members 550, 560, and 570.

Triangular region 521 in FIG. 5 represents the spread of trajectories contributed from the left side of target member 550 to the surface center point 512 of the substrate 510. Triangular region 522 represents the spread of trajectories contributed by the left side of target member 560 to substrate surface point 512. Triangular region 523 represents the spread of trajectories contributing particles from target member 570 to surface point 512. Triangular region 524 represents a spread of hypothetical trajectories that are "shadowed" or blocked from travelling from the third target member 570 to substrate surface point 513 by the intervening portion of the right side of target member 560.

As seen in FIG. 5, the maximum attack angle $\theta_1$ of trajectory spread 521 remains substantially unchanged from the corresponding spread in the reference system 200 (FIG. 2). However, because trajectory spread 522 originates from a higher height $H_2$, and trajectory 523 originates from an even higher height $H_3$, the attack angles of these latter trajectory spreads, 522 and 523, are less than the corresponding angles of attack for corresponding portions of the planar target 220 in reference system 200. Accordingly, the step coverage for center surface point 512 is improved with respect to the contributions from the second and third target members, 560 and 570.

Moreover, in FIG. 5 (concave target configuration), the substrate center point 512 is not uniquely situated to receive particles along the shortest particle travel distances ($d_p$'s) form all emission points on the target 520. Note in contrast, that the center point 212 of reference system 200 (FIG. 2) is closer in the aggregate to all target source points than any other particle receiving point on the substrate surface. Thus in FIG. 2, the substrate center point tends to receive the highest cumulative deposition rate (see FIG. 1B) while points spaced horizontally away receive lower rates of deposition. This leads to nonuniformity of deposition film thickness across substrate 210. On the other hand, in FIG. 5, a more uniform distribution of film thickness is obtained because the substrate center point 512 is not uniquely advantaged in terms of particle travel distances and aggregate deposition rate.

FIG. 6 shows a staggered configuration 600 wherein the first and third target members 650 and 670 are at height $H_1$ while the second target member 660 is at a greater height $H_2$. Because of this staggered arrangement, the third target member 670 acts as a shadow mask for various trajectory spreads emanating from the higher target member 660. The "shadowed" or blocked particle trajectories include a hypothetical first spread 625 emanating from the right side of target member 660 toward the left region 611 of substrate 610 and a hypothetical second spread 626 emanating from the left side of target member 660 towards the right region 613 of the substrate 610. The first and second spreads 625 and 626 are not the only trajectories blocked by target member 670. There are many others. Spreads 625 and 626 are illustrated merely as examples.

The trajectory blocking action of the lower target member 670 is referred to herein as "self-collimation" since one portion of the overall target 620 blocks out various trajectories from other portions of the same overall target 620. Self-collimation may be used to provide a variety of advantageous distributions of deposition across the substrate surface in terms of step coverage uniformity and film thickness uniformity.

Although the staggered target arrangement of FIG. 6 shows only two horizontal layers of target members (at respective heights, $H_1$ and $H_2$), it should be apparent that the target may have many more layers, each such layer being occupied by one or a plurality of independently powered target members. The organization of the target members in the various layers may be modified and their active surface areas may be resized as desired to provide all sorts of self-collimating and other effects.

Figure 7:
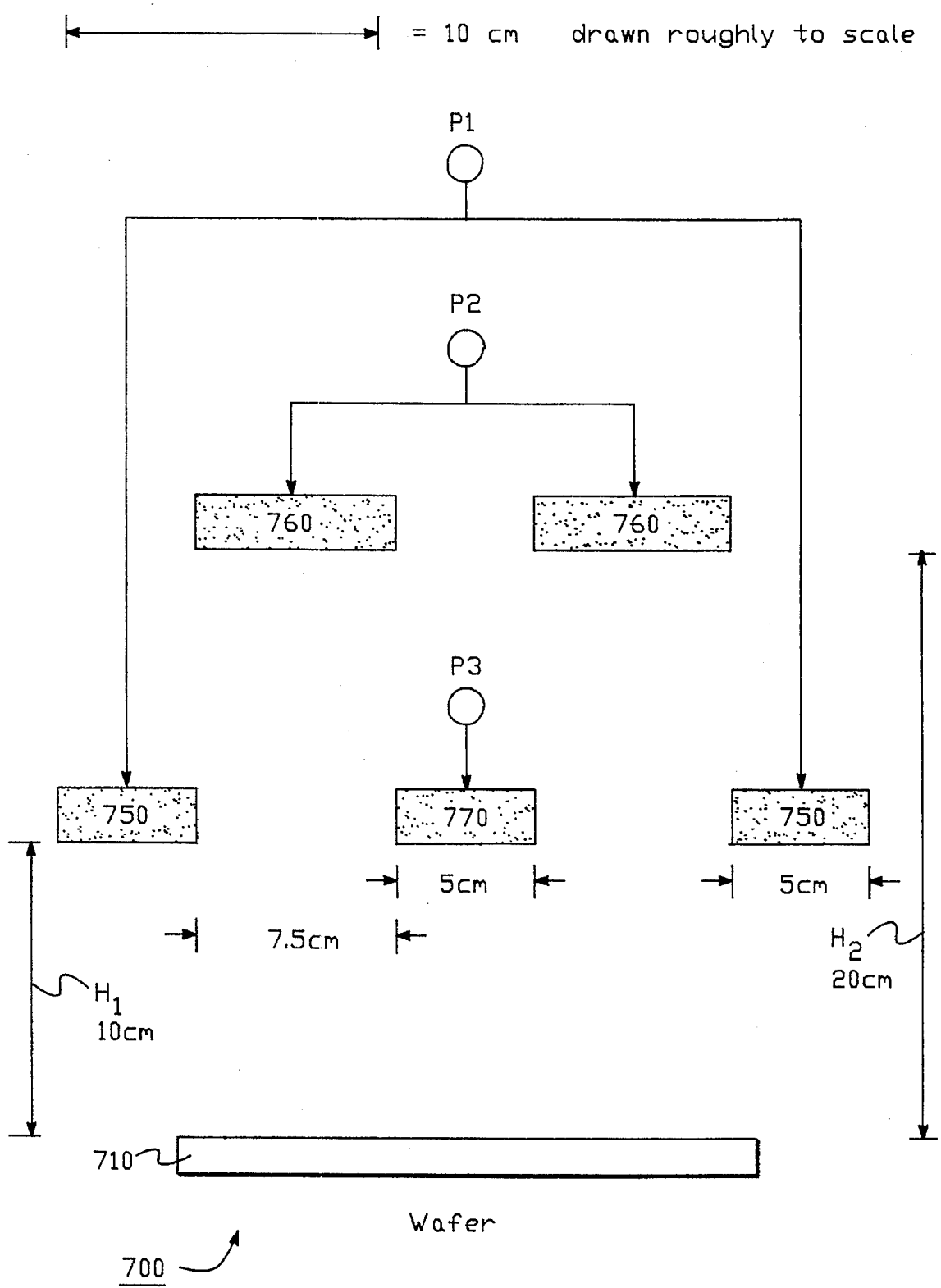
FIG. 7 is a cross sectional view of a first specific configuration having unique deposition attributes.

FIG. 7 is a cross-sectional view showing a first specific implementation similar to the staggered configuration shown in FIG. 6. Like reference numbers in the "700" number series are used in FIG. 7 for elements having corresponding components numbered in the "600" number series in FIG. 6. The diameter $W_S$ of semiconductor wafer 710 is 20 cm. The active cross-sectional width of target member 750 is 5 cm. on the left and 5 cm. on the right side. The active diameter of target member 770 is 5 cm. Target members 750 and 770 are at a height of $H_1=10$ cm. The active cross-sectional width of target member 760 is 7.5 cm. on the left and 7.5 cm. on the right. Target member 760 is at a height of $H_2=20$ cm.

The power densities $P_1$ and $P_2$ respectively applied to target members 750 and 760 are approximately equal to one another in terms of kilowatts per $cm^2$. The power density $P_3$ applied to target member 770 is preferably in the range 0.60 $P_1$ to 1.00 $P_1$.

Comparing the simulated deposition characteristics of staggered configuration 700 against that of the reference system 200 (FIG. 2), it was found that average deposition rate decreased by 9.9%. However, film thickness uniformity increased by 60%, which is considered a significant improvement. There was no significant change in step coverage. Step coverage uniformity increased by 42%. Accordingly, although the staggered configuration 700 has the drawback of a slightly reduced deposition rate when compared to the reference system 200, the staggered configuration 700 has the advantage of providing a substantially improved uniformity of deposition film thickness and a substantially improved uniformity in step coverage.

Figure 8:
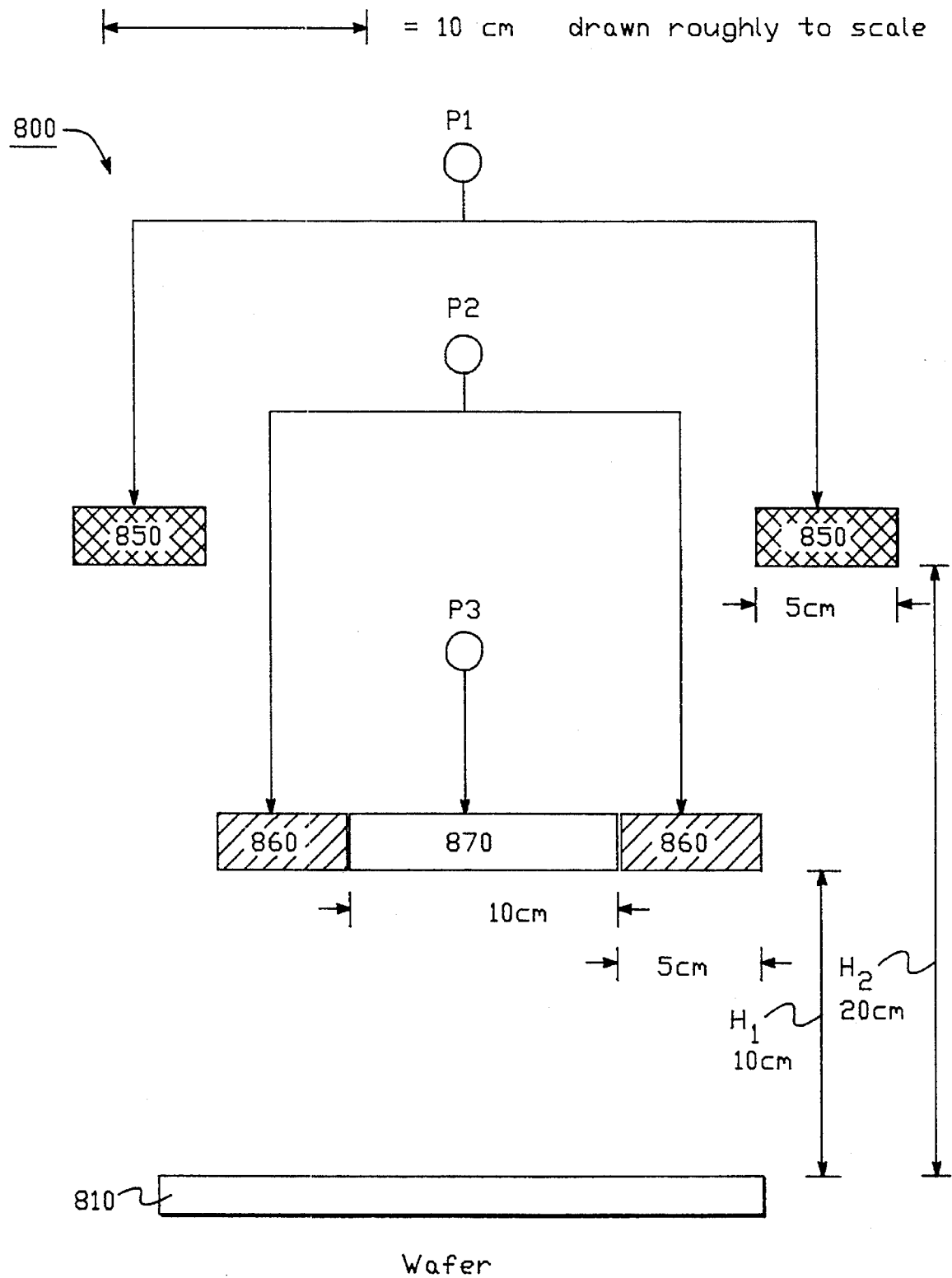
FIG. 8 is a cross sectional view of a second specific configuration having unique deposition attributes.

FIG. 8 shows the cross-sectional view of yet another specific embodiment having a nonplanar target. Like numbers in the "800" number series are used for elements having corresponding components numbered in the "700" number series in FIG. 7. The wafer diameter in FIG. 8 remains unchanged at 20 cm. Left and right sides of target member 860 are each 5 cm. in cross-sectional width. Target member 870 has a diameter of 10 cm. If desired, target members 860 and 870 may be merged into a unitary disk having a diameter of 20 cm. The height of target members 860 and 870 is $H_1=10$ cm. Target member 850 has an effective cross-sectional width of 5 cm. on the left and 5 cm. on the right. The height of target member 850 is $H_2=20$ cm. The power density applied to each of the target members, 850, 860, 870 is substantially equal ($P_1=P_2=P_3$).

In comparison to the reference system 200 (FIG. 2) the specific configuration 800 of FIG. 8 showed the following deposition characteristics when modeled using SPEEDIE: Deposition rate decreased by 23%. Film thickness uniformity decreased by 2%. Step coverage increased by 23%. And step coverage uniformity increased by the surprising amount of 70%.

Comparing configuration 800 (FIG. 8) against configuration 700 (FIG. 7), it is seen that significantly improved step coverage and step coverage uniformity may be obtained if one is willing to sacrifice on deposition rate (the latter is measured in terms of microns per minute).

Figure 9:
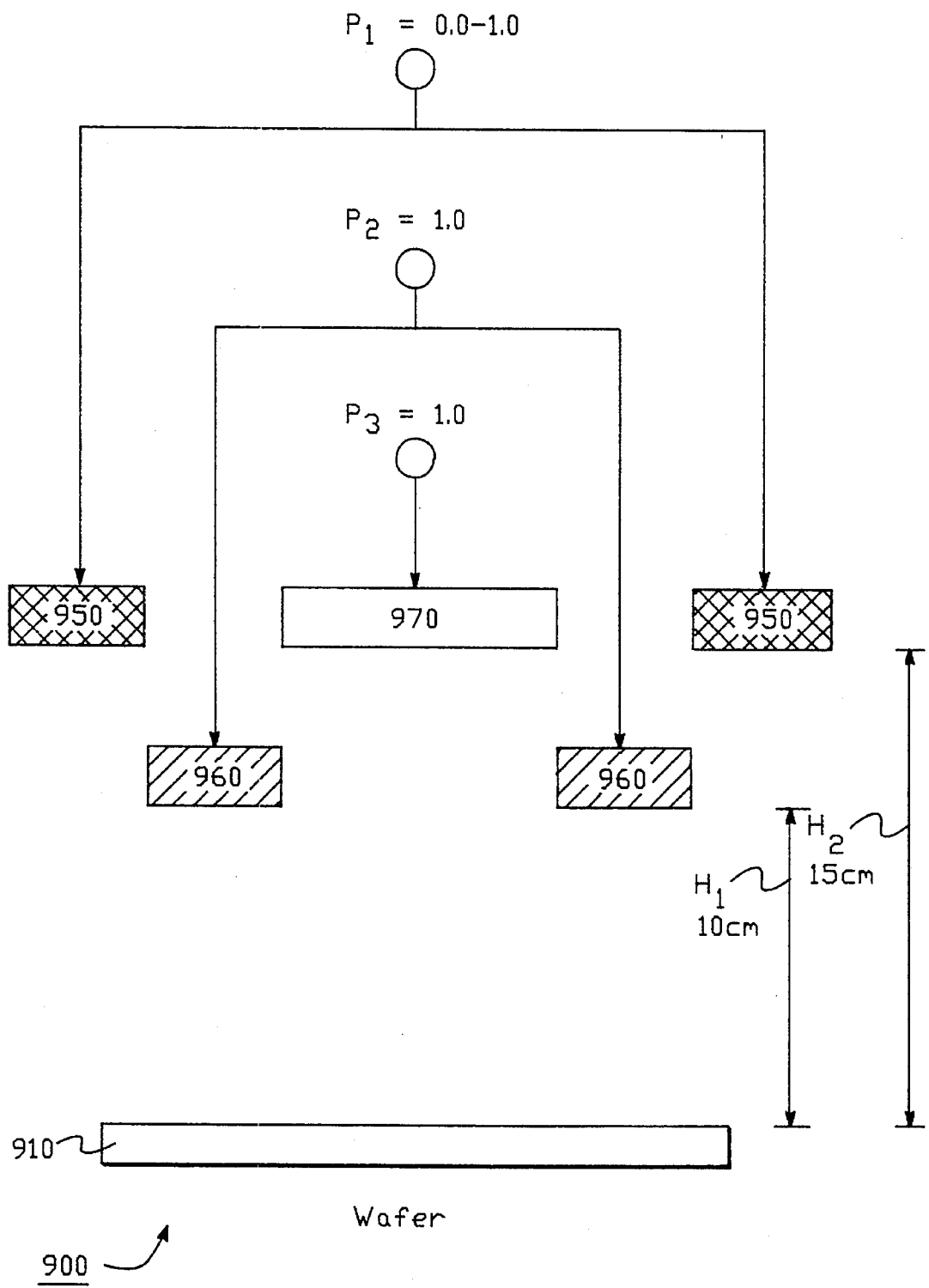
FIG. 9 is a cross sectional view of a third specific configuration having unique deposition attributes.

FIG. 9 shows yet another specific configuration 900. Like reference numbers in the "900" number system are used in FIG. 9 for elements having corresponding components in FIG. 8 that are numbered in the "800" number system. Semiconductor wafer 910 is again 20 cm. in diameter. Target member 950 is positioned at height $H_2=15$ cm. and has a cross-sectional width of 5 cm. on the left side and 5 cm. on the right side. Target member 960 is positioned at height $H_1=10$ cm. and has a cross-sectional width of 5 cm. on the left side and 5 cm. on the right side. Target member 970 is positioned at height $H_2=15$ cm. and has a cross-sectional width of 10 cm. Power densities $P_2$ and $P_3$ are approximately equal to one another while power density $P_1$ can be equal to or less than $P_2$ and $P_3$.

In comparison to the reference system 200 (FIG. 2) the specific configuration 900 of FIG. 9 exhibited the following deposition characteristics when modeled: deposition rate decreased by 10%, film thickness uniformity increased by 24%, step coverage increased by 5%, and step coverage uniformity increased by 56%.

In comparison to the deposition characteristics of specific configuration 800 (FIG. 8), it is seen for FIG. 9 that a trade-off may be obtained wherein step coverage and step coverage uniformity are sacrificed in order to obtain an improvement in film thickness uniformity and deposition rate.

Figure 10:
FIG. 10 is a cross sectional view of a fourth specific configuration having unique deposition attributes.
Figure 10:
Figure 10:

FIG. 10 is a cross-sectional view of yet another specific configuration 1000. Like reference numbers in the "1000" number system are used in FIG. 10 for elements having corresponding components numbered in the "900" number series in FIG. 9. The diameter of wafer 1010 remains at 20 cm. Target member 1050 is positioned at height $H_1=10$ cm. and has an effective cross-sectional width of 5 cm. on the left and 5 cm. on the right. Target member 1060 is positioned at height $H_2=20$ cm. and has an effective cross-sectional width of 5 cm. on the left and 5 cm. on the right. Target member 1070 is positioned at height $H_3=15$ cm. and has an effective cross-sectional width of 10 cm. The power density applied to each of the target members 1050, 1060, and 1070 is approximately equal.

Comparing the specific configuration 1000 of FIG. 10 against the reference system 200 (FIG. 2), the following deposition characteristics were observed through modeling: deposition rate decreased by 9.2%, thickness uniformity increased by 53%, step coverage increased by 4.3%, and step coverage uniformity increased by 26%.

Comparing the results of configuration 1000 (FIG. 10) against those of configuration 900 (FIG. 9), one can see that a further trade-off may be made wherein film thickness uniformity is improved while suffering a loss in step coverage uniformity.

Given the large number of possible trade offs, the inventors herein devised a figure of merit system and a method for identifying the nonplanar configurations having the highest figure of merits under conditions where one or more parameters are varied such as target member heights $H_x$ through $H_y$, target member active widths $W_x$ through $W_y$, target member power levels $P_x$ through $P_y$, and so forth. The figure of merit is generally defined as:

$$M_k = \Sigma a_i \cdot (f_{ik}/f_{iR})$$

where i represents a deposition attribute selected from the group comprised of, but not limited to: (a) average deposition rate; (b) average bottom coverage; (c) flat coverage uniformity; (d) bottom coverage uniformity; (e) minimum sidewall bottom thickness; (f) step coverage; (g) step coverage uniformity; (h) film thickness uniformity. And further where k represents a particular nonplanar target configuration under consideration, $f_{ik}$ represents the modeled ith deposition attribute of nonplanar target configuration k, $f_{iR}$ represents the modeled ith deposition attribute of a fixed reference configuration R which is usually a planar target configuration; and $a_i$ represents a predefined weight attached to the ith deposition attribute.

By way of one example, height $H_3$ of the center one of three target members was fixed at 5 cm while heights $H_1$ and $H_2$ of the respective outer and middle target members were allowed to vary. Each of the three target members had an effective emissive width of 5 cm. The substrate had a diameter of 15 cm. Power density in terms of kilowatts per $cm^2$ was the same for each target member. The figure of merit was set to give equal weight to the following five attributes: (a) average deposition rate; (b) average bottom coverage; (c) flat coverage uniformity; (d) bottom coverage uniformity; (e) minimum bottom thickness, while zero weight was given to all other attributes. The resulting figure of merit value for each configuration k of H1 and H2 was plotted as a corresponding color on a two dimensional graph having H1 and H2 as its axes. Different colors were used for each value range, the darker or more pronounced colors being assigned to the higher values of merit. The highest figures of merits were found using this color contour plotting approach to occur at or near the region, H1=2.5 cm and H2=3.5 cm. The planar configuration of H1=H2=H3=5 cm. was found to have one of the lowest figures of merit, thus substantiating the inventors' contention that a nonplanar target in general should give improved performance over a planar target when one takes into account attributes such as bottom coverage uniformity. The optimum configuration for the given fixed parameters and the weights attached to the deposition attributes in the figure of merit calculations is accordingly the concave configuration: $H_1=2.5$ cm and $H_2=3.5$ cm and $H_3=5.0$ cm.

The above configuration optimization method can of course be used to find optimum configurations for other weightings of deposition attributes and other settings of target member geometries and substrate geometries. It is not limited to any particular number of target members.

The above disclosure is to be taken as illustrative of the invention, not as limiting its scope or spirit. Numerous modifications and variations will become apparent to those skilled in the art after studying the above disclosure.

Given the above disclosure of general concepts and specific embodiments, the scope of protection sought is to be defined by the claims appended hereto.

What is claimed is:

1. A method for sputter depositing material onto a substantially planar surface of a supplied substrate, said substrate surface having a top surface plane associated therewith, said method comprising the steps of:

(a) providing a nonplanar target composed of the material to-be-sputter deposited onto the substrate surface, said target having first; second/and third material-emitting portions defined to extend over a prespecified target width;

(b) positioning the nonplanar target relative to the substrate surface such that the first material-emitting portion is at a respective first height relative to the top surface plane of the substrate, and such that the second material-emitting portion is at a respective and different second height relative to the top surface plane, and such that the third material-emitting portion is at a respective third height relative to the top surface plane, and such that a maximum angle of attack is defined for all linear trajectories of deposition material moving from the nonplanar target to corresponding points on the substrate surface, an angle of attack being an angle made between a corresponding linear trajectory and a normal of said top surface plane, said maximum angle of attack being less than a hypothetical maximum angle of attack that would have been provided by a hypothetical planar target having a single planar material-emitting portion extending over said target width and being positioned parallel to the substrate surface at a hypothetical height equal to the smallest of the first, second, and third heights; and (c) separately applying emission-inducing energy to the first, second, and third portions of the nonplanar target, the emission-inducing energy being applied in the form of a first emission-inducing power supplied respectively to the first material-emitting portion of the target, a different second emission-inducing power supplied respectively to the second material-emitting portion of the target, and a third emission-inducing power supplied respectively to the third material-emitting portion of the target, so as to induce respective rates of emission of deposition material from the respective first, second, and third material-emitting portions of the nonplanar target to the substrate surface.

2. A sputter depositing method according to claim 1 wherein said step of providing a nonplanar target comprises:

(a.1) providing the first material-emitting portion as including an annular first disc having a respective first emitting surface extending parallel to the top surface plane of the substrate at the respective first height;

(a.2) providing the second material-emitting portion as including an annular second disc having a respective second emitting surface extending parallel to the top surface plane of the substrate at the respective second height, the second disc being spaced apart from and concentric with the first disc; and (a.3) providing the third material-emitting portion as including a third disc having a respective third emitting surface extending parallel to the top surface plane of the substrate at the respective third height, the third disc being spaced apart from and concentric with the first and second discs.

3. A sputter depositing method according to claim 2 wherein said step of positioning the nonplanar target comprises:

(b.1) setting the respective heights of the first, second, and third discs such that the first height is greater than the second height and such that the second height is greater than the third height.

4. A sputter depositing method according to claim 3 wherein said step of applying emission-inducing energy comprises:

(c.1) setting the respective magnitudes of the first, second, and third emission-inducing powers such that the magnitude in terms of power per-unit of emitting area of the first emission-inducing power is greater than the magnitude in terms of power per-unit of emitting area of the second emission-inducing power, and such that the magnitude in terms of power per-unit of emitting area of the second emission-inducing power is greater than the magnitude in terms of power per-unit of emitting area of the third emission-inducing power.

5. A physical vapor deposition (PVD) apparatus for sputter depositing material onto a substantially planar surface of a supplied substrate, said substrate surface having a top surface plane associated therewith, said apparatus comprising:

a nonplanar target composed of the material to-be-sputter deposited onto, the substrate surface, said target having separately-powered first, second, and third material-emitting portions respectively positioned at first, second, and third heights relative to the top surface plane of the substrate.

6. The PVD apparatus of claim 5 wherein the nonplanar target has a generally convex shape relative to the substantially planar surface of the supplied substrate.

7. The PVD apparatus of claim 5 wherein the nonplanar target has a generally concave shape relative to the substantially planar surface of the supplied substrate.

8. The PVD apparatus of claim 8 wherein:

the first material-emitting portion includes an annular first emitting surface positioned at the respective first height;

the second material-emitting portion includes an annular and symmetrical second emitting surface positioned at the respective second height generally concentrically with respect to the first emitting surface;

the third material-emitting portion includes a symmetrical third emitting surface positioned at the respective third height generally concentrically with respect to the first emitting surface; and the nonplanar target has a staggered configuration wherein said second height is greater than each of said first height and said third height.

9. The PVD apparatus of claim 8 wherein the annular first emitting surface extends substantially parallel to the top surface plane of the substrate at the respective first height;

the annular second emitting surface extends substantially parallel to the top surface plane of the substrate at the respective second height; and the third emitting surface extends substantially parallel to the top surface plane of the substrate at the respective third height.

10. A physical vapor deposition (PVD) apparatus according to claim 5 wherein said first, second, and third heights are each different from the others.

11. A physical vapor deposition apparatus according to claim 5 wherein:

(a) the substrate surface has a working cross sectional width of approximately 20 relative linear units;

(b) said first material-emitting portion defines a first annular and planar member that extends substantially parallel to the substrate surface and has a total width of approximately 30 relative linear units, the ratio between the respective working cross sectional and total widths of the substrate surface and the first annular member being approximately 20/30;

(b.1) the first height of said first annular member relative to the top surface plane of the substrate is in the range of approximately 10 to 20 relative linear units;

(c) said second material-emitting portion defines a second annular and planar member that extends substantially parallel to the substrate surface and has a total width of approximately 20 relative linear units; and (c.1) the second height of said second annular member relative to the top surface plane of the substrate is in the range of approximately 10 to 20 relative linear units, the second height being different from the first height.

12. A physical vapor deposition apparatus according to claim 5 wherein:

(a) the substrate surface has a working cross sectional width of approximately 20 relative linear units;

(b) said first material-emitting portion defines a first annular and planar member that extends substantially parallel to the substrate surface and has a total width of approximately 30 relative linear units, the ratio between the respective working cross sectional and total widths of the substrate surface and the first annular member being approximately 20/30;

(b.1) said first annular member has an active cross-sectional width of approximately 5 relative linear units on a first side thereof and an active cross-sectional width of approximately 5 relative linear units on a second side thereof;

(b.2) the first height of said first annular member relative to the top surface plane of the substrate is approximately 10 relative linear units;

(c) said second material-emitting portion defines a second annular and planar member that extends substantially parallel to the substrate surface and has a total width of approximately 20 relative linear units;

(c.1) said second annular member has an active cross-sectional width of approximately 7.5 relative linear units on a first side thereof and an active cross-sectional width of approximately 7.5 relative linear units on a second side thereof; and (c.2) the second height of said second annular member relative to the top surface plane of the substrate is approximately 20 relative linear units.

13. A physical vapor deposition (PVD) apparatus according to claim 5 wherein at least one of said first, second, and third material-emitting portions is adjustable in height.

14. A physical vapor deposition apparatus for sputter depositing material onto a substantially planar surface of a supplied substrate, said substrate surface having a top surface plane associated therewith, said substrate surface having a substrate surface width associated therewith, said apparatus comprising:
(a) a nonplanar target composed of the material to-be-sputter deposited onto the substrate surface, said target including:
 (a.1) a first material-emitting member positioned at a first height relative to the top surface plane of the substrate and having a first material-emitting planar surface area that is substantially parallel to the top surface plane of the substrate;
 (a.2) a second material-emitting member positioned at a second and different height relative to the top surface plane of the substrate and having a second material-emitting planar surface area that is substantially parallel to the top surface plane of the substrate;
(b) a powering system for applying emission-inducing energy to the nonplanar target, said powering system including:
 (b.1) a first power supply for supplying first emission-inducing power to the first material-emitting member; and
 (b.2) a second power supply for independently supplying second emission-inducing power to the second material-emitting member.

15. A physical vapor deposition apparatus according to claim 14 wherein:
(a.1a) the first material-emitting planar surface area defines an annular first disc; and
(a.2a) the second material-emitting planar surface area defines an annular second disc.

16. A physical vapor deposition apparatus according to claim 14 wherein:
the first material-emitting planar surface area is wider than the second material-emitting planar surface area; and
the first height is greater than the second height.

17. A physical vapor deposition apparatus according to claim 14 wherein at least one of the respective first and second heights of the first and second material-emitting members is adjustable.

18. A physical vapor deposition apparatus according to claim 17 wherein the emission-inducing power of at least one of the respective first and second power supplies is variable.

19. A physical vapor deposition apparatus according to claim 14,
wherein said nonplanar target further includes:
(a.3) a third material-emitting member positioned at a third height relative to the top surface plane of the substrate; and wherein said powering system further includes:
(b.3) a third power supply for independently supplying third emission-inducing power to the third material-emitting member.

20. A physical vapor deposition apparatus according to claim 19 wherein said third material-emitting member has a third material-emitting planar surface area that is substantially parallel to the top surface plane of the substrate.

21. A physical vapor deposition apparatus according to claim 20 wherein:
(a.1a) the first material-emitting planar surface area defines an annular first disc; and
(a.2a) the second material-emitting planar surface area defines an annular second disc;
(a.3a) the third material-emitting planar surface area defines a third disc.

22. A physical vapor deposition apparatus according to claim 21 wherein the first, second, and third discs are concentric, the first height is greater than the second height and the second height is greater than the third height.

23. A physical vapor deposition apparatus according to claim 21 wherein the first, second, and third discs are concentric, the first height is less than the second height and the second height is less than the third height.

24. A physical vapor deposition apparatus according to claim 23 wherein:
the width of the substrate surface is approximately 15 relative linear units, the annular first disc has a total width of approximately 15 relative linear units, such the ratio between the respective widths of the substrate surface and the annular first disc is approximately 15/15;
the first height is approximately 2.5 relative linear units;
the second height is approximately 3.5 relative linear units; and
the third height is approximately 5.0 relative linear units.

25. A physical vapor deposition apparatus according to claim 21 wherein the first, second, and third discs are concentric and the second height is greater than each of the first height and the third height.

26. A physical vapor deposition apparatus according to claim 19 wherein each of the first, second, and third heights is adjustable.

27. A physical vapor deposition apparatus according to claim 19 wherein the emission-inducing power of each of the first, second, and third power supplies is variable.

28. A physical vapor deposition apparatus according to claim 27 wherein different electrical voltages are used as a means for varying the emission-inducing power of each of the first, second, and third power supplies.

* * * * *

UNITED STATES PATENT AND TRADEMARK OFFICE
CERTIFICATE OF CORRECTION

PATENT NO. : 5,556,525
DATED : September 17, 1996
INVENTOR(S) : Zoran Krivokapik et al.

It is certified that error appears in the above-indentified patent and that said Letters Patent is hereby corrected as shown below:

Column 15, line 49, "claim 8" should be --claim 5--.
Column 18, line 30, before "the ratio" insert --that--.

Signed and Sealed this

Twenty-sixth Day of November 1996

Attest:

BRUCE LEHMAN

Attesting Officer      Commissioner of Patents and Trademarks